United States Patent
Lee

(10) Patent No.: US 9,952,789 B2
(45) Date of Patent: Apr. 24, 2018

(54) MEMORY SYSTEMS AND ELECTRONIC DEVICES INCLUDING NONVOLATILE MEMORY MODULES

(71) Applicant: SAMSUNG ELECTRONICS CO., LTD., Suwon-si, Gyeonggi-Do (KR)

(72) Inventor: Kwang-Jin Lee, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/393,844

(22) Filed: Dec. 29, 2016

(65) Prior Publication Data
US 2017/0192704 A1 Jul. 6, 2017

(30) Foreign Application Priority Data
Dec. 30, 2015 (KR) .................. 10-2015-0189986

(51) Int. Cl.
| | |
|---|---|
| H03M 13/00 | (2006.01) |
| G06F 3/06 | (2006.01) |
| G06F 11/10 | (2006.01) |
| G11C 29/52 | (2006.01) |
| H03M 13/29 | (2006.01) |
| H03M 13/35 | (2006.01) |

(52) U.S. Cl.
CPC ............ *G06F 3/0619* (2013.01); *G06F 3/064* (2013.01); *G06F 3/0634* (2013.01); *G06F 3/0659* (2013.01); *G06F 3/0679* (2013.01); *G06F 11/1068* (2013.01); *G11C 29/52* (2013.01); *H03M 13/29* (2013.01); *H03M 13/356* (2013.01)

(58) Field of Classification Search
CPC ...... G06F 3/0619; G06F 3/0634; G06F 3/064; G06F 3/0659; G06F 11/1068
See application file for complete search history.

(56) References Cited

U.S. PATENT DOCUMENTS

| | | | |
|---|---|---|---|
| 8,028,119 B2 | 9/2011 | Miura | |
| 8,108,641 B2 * | 1/2012 | Goss | G06F 12/1408 711/163 |
| 8,429,333 B2 * | 4/2013 | Yano | G06F 12/0246 711/103 |

(Continued)

*Primary Examiner* — Esaw T Abraham
(74) *Attorney, Agent, or Firm* — F. Chau & Associates, LLC

(57) ABSTRACT

A memory system includes a nonvolatile memory module and a memory controller. The nonvolatile memory module includes a plurality of memory chips and a module controller disposed on a printed circuit board. The module controller controls operations of the plurality of memory chips. Each of the plurality of memory chips includes a plurality of nonvolatile memory cells and operates in an operation mode. The operation mode is either a memory mode or a storage mode. The memory controller performs a write operation and a read operation on the nonvolatile memory module, and performs a first error check and correction (ECC) operation on data communicated with the nonvolatile memory module. One of the module controller or the plurality of memory chips performs a second ECC operation on data stored in the plurality of memory chips based on the operation mode of the plurality of memory chips.

20 Claims, 10 Drawing Sheets

(56) References Cited

U.S. PATENT DOCUMENTS

| | | | |
|---|---|---|---|
| 8,738,866 B2* | 5/2014 | Sonoda | G06F 3/0625 |
| | | | 711/114 |
| 8,745,313 B2* | 6/2014 | Yano | G06F 12/0246 |
| | | | 707/800 |
| 8,837,217 B2* | 9/2014 | Chu | G06F 12/0246 |
| | | | 365/185.08 |
| 8,862,963 B2 | 10/2014 | Nakanishi et al. | |
| 8,880,781 B2* | 11/2014 | Hong | G06F 1/3275 |
| | | | 365/185.33 |
| 9,274,892 B2* | 3/2016 | Tsern | G06F 11/1008 |
| 9,465,731 B2* | 10/2016 | Sinclair | G06F 12/0246 |
| 9,569,320 B2* | 2/2017 | Werner | G06F 11/2056 |
| 2010/0100797 A1 | 4/2010 | Chen | |
| 2013/0268728 A1 | 10/2013 | Ramanujan et al. | |
| 2014/0013038 A1 | 1/2014 | Hsiao | |
| 2014/0195876 A1 | 7/2014 | Nachimuthu et al. | |
| 2014/0304455 A1 | 10/2014 | Scaramuzzo et al. | |
| 2015/0049547 A1 | 2/2015 | Kim | |
| 2015/0143185 A1 | 5/2015 | Motwani | |

* cited by examiner

MEMORY SYSTEMS AND ELECTRONIC DEVICES INCLUDING NONVOLATILE MEMORY MODULES

CROSS-REFERENCE TO RELATED APPLICATION

This application claims priority under 35 U.S.C. § 119 to Korean Patent Application No. 10-2015-0189986, filed on Dec. 30, 2015 in the Korean Intellectual Property Office (KIPO), the disclosure of which is incorporated by reference herein in its entirety.

TECHNICAL FIELD

Exemplary embodiments of the inventive concept relate to a semiconductor memory device, and more particularly to a memory system and an electronic device including a nonvolatile memory module.

DISCUSSION OF RELATED ART

Semiconductor memory devices for storing data may be classified as volatile memory devices or nonvolatile memory devices. Volatile memory devices are typically configured to store data by charging or discharging capacitors in memory cells, and are widely used as the main memory of various apparatuses. Volatile memory devices, such as Dynamic Random Access Memory (DRAM) and Static Random Access Memory (SRAM), retain stored data when power is supplied and lose the stored data when power is off.

Non-volatile memory devices such as flash memory devices may maintain stored data even though power is off, and are widely used for storing program codes and/or data in computers, mobile devices, etc.

Because of demands for high memory capacity, high operation speed, and low power consumption of the memory devices, new memory devices of various types have been developed to realize high integration rate of DRAM, high speed of SRAM, and non-volatility of flash memory in a single memory device. For example, Phase Change Random Access Memory (PRAM) using phase change materials, Resistance Random Access Memory (RRAM) using materials having variable resistance such as transition-metal oxides, and Magnetic Random Access Memory (MRAM) using ferromagnetism materials are attracting attention as memory devices of the next generation. Such materials have common characteristics, such as resistance that varies depending on magnitude and/or direction of applied voltage and/or current and can be maintained (e.g., non-volatility) even though the applied voltage and/or current is intercepted. As such, refresh operations may not be required.

Each memory cell of resistive memory devices may be formed with one resistive element and one switching element so that data may be stored by controlling voltage and/or current of a bit line and a word line to change resistance of the resistive element.

SUMMARY

According to an exemplary embodiment of the inventive concept, a memory system includes a nonvolatile memory module and a memory controller. The nonvolatile memory module includes a plurality of memory chips and a module controller disposed on a printed circuit board (PCB). The module controller controls operations of the plurality of memory chips. Each of the plurality of memory chips includes a plurality of nonvolatile memory cells and is configured to operate in an operation mode. The operation mode may be either a memory mode or a storage mode. The mean data storage time of the memory mode is less than the mean data storage time of the storage mode. The memory controller performs a write operation and a read operation on the nonvolatile memory module, and performs a first error check and correction (ECC) operation on data communicated with the nonvolatile memory module. One of the module controller or the plurality of memory chips performs a second ECC operation on data stored in the plurality of memory chips based on the operation mode of the plurality of memory chips.

According to an exemplary embodiment of the inventive concept, a memory system includes a nonvolatile memory module and a memory controller. The nonvolatile memory module includes a plurality of memory chips and a module controller disposed on a printed circuit board (PCB). The module controller controls operations of the plurality of memory chips. Each of the plurality of memory chips includes a plurality of nonvolatile memory cells and is configured to operate in an operation mode. The operation mode may be either a memory mode or a storage mode. The mean data storage time of the memory mode is less than the mean data storage time of the storage mode. The memory controller performs a write operation and a read operation on the nonvolatile memory module, and performs a first error check and correction (ECC) operation on data communicated with the nonvolatile memory module. One of the module controller or the plurality of memory chips performs a second ECC operation on data stored in the plurality of memory chips based on whether the operation mode of the plurality of memory chips is variable during a normal operation of the plurality of memory chips.

According to an exemplary embodiment of the inventive concept, an electronic device includes a nonvolatile memory module, a read only memory (ROM), a central processing unit (CPU), and a memory controller. The nonvolatile memory module includes a plurality of memory chips and a module controller disposed on a printed circuit board (PCB). The module controller controls operations of the plurality of memory chips. Each of the plurality of memory chips includes a plurality of nonvolatile memory cells and is configured to operate in an operation mode. The operation mode may be either a memory mode or a storage mode. The mean data storage time of the memory mode is less than the mean data storage time of the storage mode. The ROM stores configuration information representing the operation mode of the plurality of memory chips. The memory controller, under a control of the CPU, performs a write operation and a read operation on the nonvolatile memory module, and performs a first error check and correction (ECC) operation on data communicated with the nonvolatile memory module. One of the module controller or the plurality of memory chips performs a second ECC operation on data stored in the plurality of memory chips, based on whether the operation mode of the plurality of memory chips is variable during a normal operation of the plurality of memory chips and whether the plurality of memory chips operates in the memory mode or the storage mode.

According to an exemplary embodiment of the inventive concept, a method of operating a memory system is provided. The memory system includes a plurality of memory chips with a first error check and correction (ECC) engine and a module controller with a second ECC engine. It is determined whether an operation mode of the plurality of memory chips is fixed as either a memory mode or a storage mode. The mean data storage time of the memory mode is less than the mean data storage time of the storage mode. One of the first ECC engine and the second ECC engine is activated when the operation mode of the plurality of memory chips is fixed. The first ECC engine is activated when the operation mode of the plurality of memory chips is not fixed. An ECC operation is performed on data stored in the plurality of memory chips using an activated ECC engine among the first ECC engine and the second ECC engine.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Exemplary embodiments of the inventive concept are directed to a memory system including a nonvolatile memory module that is able to operate in various modes and effectively perform an error check and correction (ECC) operation.

Exemplary embodiments of the inventive concept are directed to an electronic device including the nonvolatile memory module.

Figure 1:
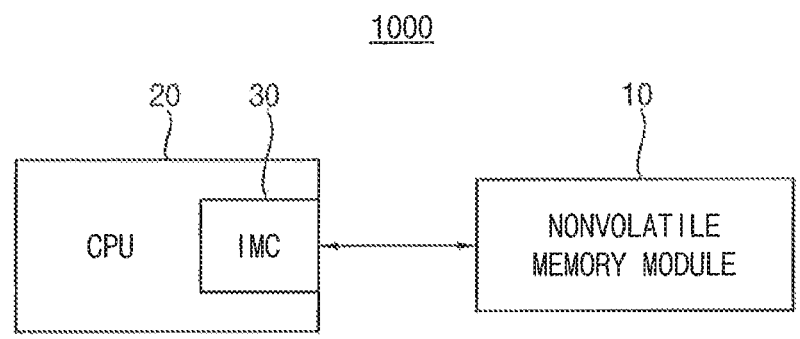
FIG. 1 is a block diagram illustrating an electronic device according to an exemplary embodiment of the inventive concept.

FIG. 1 is a block diagram illustrating an electronic device according to an exemplary embodiment of the inventive concept.

Referring to FIG. 1, an electronic device 1000 includes a memory system, which includes a nonvolatile memory module 10 and a memory controller IMC 30 controlling operations of the nonvolatile memory module 10, and a central processing unit (CPU) 20.

Although the electronic device 1000 in FIG. 1 is illustrated to include one nonvolatile memory module 10 for ease of explanation, the electronic device 1000 may include two or more nonvolatile memory modules 10.

The nonvolatile memory module 10 may include a plurality of nonvolatile memory chips. Therefore, the nonvolatile memory module 10 may maintain stored data while power is off. Since the nonvolatile memory module 10 includes the plurality of nonvolatile memory chips, the nonvolatile memory module 10 may operate in either a memory mode or a storage mode. During the memory mode, the plurality of nonvolatile memory chips is used as a working memory that temporarily stores data required for an operation of the CPU 20. During the storage mode, the plurality of nonvolatile memory chips is used as a data storage area that preserves programs and data. In other words, the mean data storage time of the memory mode may be less than the mean data storage time of the storage mode.

As illustrated in FIG. 1, the memory controller 30 may be included in the CPU 20. The memory controller 30 included in the CPU 20 may be referred to as an integrated memory controller (IMC).

However, the inventive concept is not limited thereto. For example, according to an exemplary embodiment of the inventive concept, the memory controller 30 and the CPU 20 may be separately formed.

In the memory system including the nonvolatile memory module 10 and the memory controller 30, the memory controller 30 may perform a first error check and correction (ECC) operation on data communicated with the nonvolatile memory module 10. In this case, the nonvolatile memory module 10 may further include an ECC code chip for storing an ECC code generated by the first ECC operation.

Figure 2:
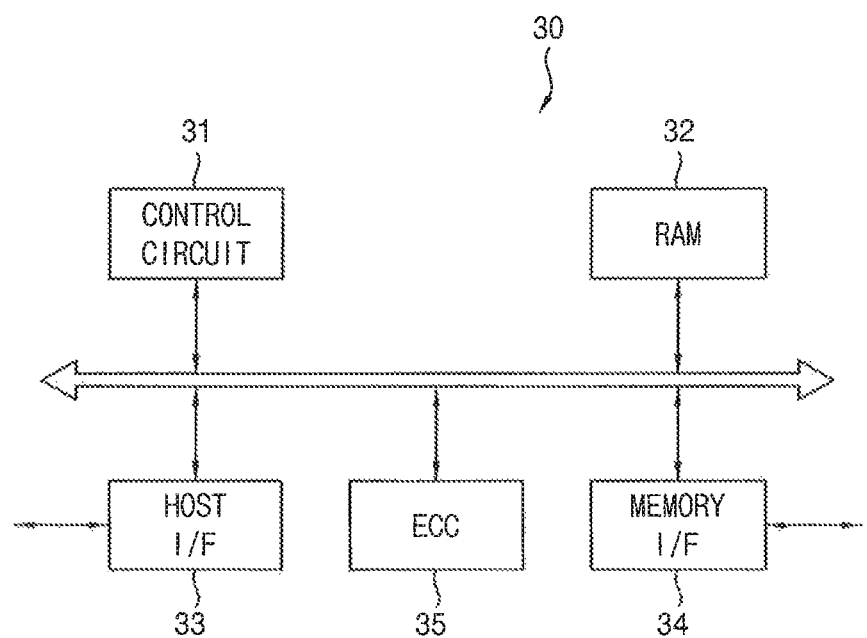
FIG. 2 is a diagram illustrating an example of a memory controller included in the electronic device of FIG. 1 according to an exemplary embodiment of the inventive concept.

FIG. 2 is a diagram illustrating an example of a memory controller included in the electronic device of FIG. 1 according to an exemplary embodiment of the inventive concept.

The memory controller 30 may control data transfer between the CPU 20 and the nonvolatile memory module 10.

Referring to FIG. 2, the memory controller 30 may include a control circuit 31, a buffer memory RAM 32, a host interface 33, a memory interface 34, and a first ECC engine 35.

The control circuit 31 may perform operations for the data transfer between the CPU 20 and the nonvolatile memory module 10.

The buffer memory 32 may be implemented with a DRAM, an SRAM, a PRAM, a ferroelectric random access memory (FRAM), a RRAM, a MRAM, etc.

The buffer memory 32 may be an operational memory of the control circuit 31. According to exemplary embodiments of the inventive concept, the buffer memory 32 may be included in the memory controller 30, or may be outside of the memory controller 30.

The host interface 33 may be coupled to the CPU 20 in FIG. 1, and the memory interface 34 may be coupled to the nonvolatile memory module 10 in FIG. 1. The control circuit 31 may communicate with the CPU 20 via the host interface 33.

Further, the control circuit 31 may communicate with the nonvolatile memory module 10 via the memory interface 34.

When the memory controller 30 performs a write operation on the nonvolatile memory module 10, the host interface 33 may receive a write data, which is to be stored in the nonvolatile memory module 10, from the CPU 20. The first ECC engine 35 may generate a first ECC code for the write data, and the memory interface 34 may provide the write data and the first ECC code to the nonvolatile memory module 10. The nonvolatile memory module 10 may store the write data in at least one of the plurality of nonvolatile memory chips and store the first ECC code in the ECC code chip.

When the memory controller 30 performs a read operation on the nonvolatile memory module 10, the control circuit 31 may generate a command signal and an address signal, the memory interface 34 may provide the command signal and the address signal to the nonvolatile memory module 10. Based on the command signal and the address signal, the nonvolatile memory module 10 may output read data stored in the plurality of nonvolatile memory chips and the first ECC code, which corresponds to the read data, stored in the ECC code chip. When the memory interface 34 receives the read data and the first ECC code from the nonvolatile memory module 10, the first ECC engine 35 may correct an error of the read data based on the first ECC code, and the host interface 33 may provide the corrected read data to the CPU 20.

As described above, since the memory controller 30 performs the first ECC operation on the data communicated with the nonvolatile memory module 10, the memory system may correct a data error that occurs during the process of transmitting data between the memory controller 30 and the nonvolatile memory module 10.

In addition, the nonvolatile memory module 10 may internally perform a second ECC operation on data stored in the plurality of nonvolatile memory chips. Therefore, the nonvolatile memory module 10 may internally correct a data error that occurs during the process of storing the write data, which is received from the memory controller 30, in the plurality of nonvolatile memory chips and during the process of reading the read data from the plurality of nonvolatile memory chips.

As described above with reference to FIGS. 1 and 2, according to an exemplary embodiment of the inventive concept, in the memory system included in the electronic device 1000, the memory controller 30 may perform the first ECC operation on the data communicated with the nonvolatile memory module 10, such that the memory controller 30 may correct a data error that occurs during the process of transmitting data between the memory controller 30 and the nonvolatile memory module 10. The nonvolatile memory module 10 may internally perform the second ECC operation on the data stored in the plurality of nonvolatile memory chips, such that the nonvolatile memory module 10 may internally correct a data error that occurs during the process of storing the write data, which is received from the memory controller 30, in the plurality of nonvolatile memory chips and during the process of reading the read data from the plurality of nonvolatile memory chips. Since the memory system hierarchically performs the first ECC operation and the second ECC operation, operation reliability of the memory system may be further increased.

As described above, since the nonvolatile memory module 10 includes the plurality of nonvolatile memory chips, the nonvolatile memory module 10 may operate in either the memory mode or the storage mode. The second ECC operation, which is internally performed by the nonvolatile memory module 10, may be performed in different ways based on whether an operation mode of the plurality of nonvolatile memory chips is fixed (e.g., as one of the memory mode and the storage mode) at an initial power-up stage or variable (e.g., the operation mode is changed between the memory mode and the storage mode during normal operation), and whether the plurality of nonvolatile memory chips operates in the memory mode or the storage mode.

The second ECC operation will be described in detail below with reference to FIGS. 3 to 12.

Figure 3:
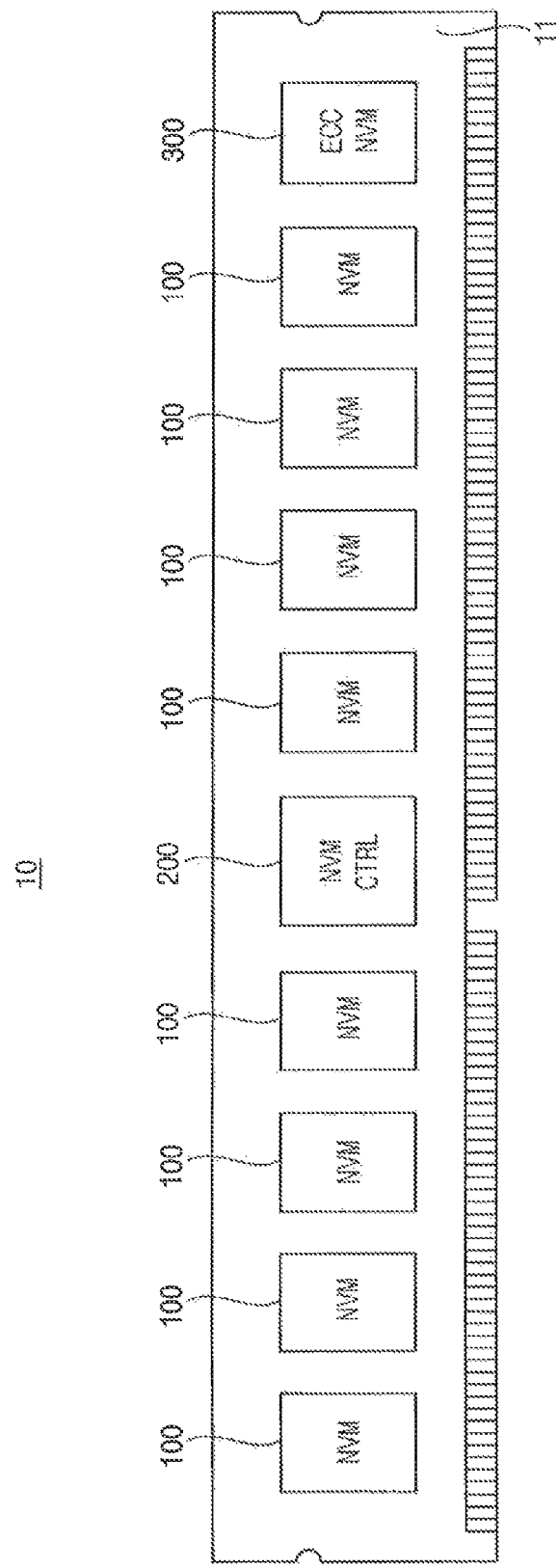
FIG. 3 is a diagram illustrating an example of a nonvolatile memory module included in the electronic device of FIG. 1 according to an exemplary embodiment of the inventive concept.

FIG. 3 is a diagram illustrating an example of a nonvolatile memory module included in the electronic device of FIG. 1 according to an exemplary embodiment of the inventive concept.

Referring to FIG. 3, the nonvolatile memory module 10 may include a plurality of nonvolatile memory chips (NVM) 100, an ECC code chip (ECC NVM) 300, and a module controller (NVM CTRL) 200.

As illustrated in FIG. 3, the plurality of nonvolatile memory chips 100 may be disposed on a printed circuit board (PCB) 11, the module controller 200 may be disposed in the middle of the plurality of nonvolatile memory chips 100 on the PCB 11, and the ECC code chip 30 may be disposed at a side portion of the PCB 11.

According to an exemplary embodiment of the inventive concept, the plurality of nonvolatile memory chips 100, the ECC code chip 300, and the module controller 200 may be disposed on the PCB 11 according to a nonvolatile dual in-line memory module (NVDIMM) standard.

Each of the plurality of nonvolatile memory chips 100 may include a plurality of nonvolatile memory cells.

According to an exemplary embodiment of the inventive concept, each of the plurality of nonvolatile memory chips 100 may have a three dimensional structure in which the plurality of nonvolatile memory cells thereof are vertically oriented such that at least one memory cell is located over another memory cell.

The module controller 200 may receive a command signal, an address signal, and data from the memory controller 30, and may control operations of the plurality of nonvolatile memory chips 100 by providing the command signal, the address signal, and/or the data to at least one of the plurality of nonvolatile memory chips 100.

According to an exemplary embodiment of the inventive concept, data transmission lines between the module controller 200 and the plurality of nonvolatile memory chips 100 may be coupled in a point-to-point topology. Command transmission lines and address transmission lines between the module controller 200 and the plurality of nonvolatile memory chips 100 may be coupled in a multi-drop topology, a daisy-chain topology, a fly-by daisy-chain topology, or the like. According to an exemplary embodiment of the inventive concept, the command transmission lines and the address transmission lines between the module controller 200 and the plurality of nonvolatile memory chips 100 may be also coupled in a point-to-point topology.

With the module controller 200 buffering signals from the memory controller 30, for example, the command signal, the address signal, and the data, and then providing the command signal, the address signal, and the data to the plurality of nonvolatile memory chips 100, the memory controller 30 may control the nonvolatile memory module 10 by driving a single load The ECC code chip 300 may include a plurality of nonvolatile memory cells.

During the write operation, the module controller 200 may receive the write data and the first ECC code from the memory controller 300, store the write data in at least one of the plurality of nonvolatile memory chips 100, and store the first ECC code in the ECC code chip 300. During the read operation, the module controller 200 may read the read data from the plurality of nonvolatile memory chips 100, read the first ECC code corresponding to the read data from the ECC code chip 300, and provide the read data and the first ECC code to the memory controller 300.

In addition, one of the module controller 200 and the plurality of nonvolatile memory chips 100 may perform the second ECC operation on the data stored in the plurality of nonvolatile memory chips 100. According to an exemplary embodiment of the inventive concept, the module controller 200 may activate one of a second ECC engine, which is included in the plurality of nonvolatile memory chips 100, and a third ECC engine, which is included in the module controller 200, and deactivate the other of the second ECC engine and the third ECC engine. The activation/deactivation process is performed based on whether the operation mode of the plurality of nonvolatile memory chips 100 is fixed or variable and whether the plurality of nonvolatile memory chips 100 operate in the memory mode or the storage mode. In this case, the activated one of the second ECC engine or the third ECC engine may perform the second ECC operation on the data stored in the plurality of nonvolatile memory chips 100.

Figure 4:
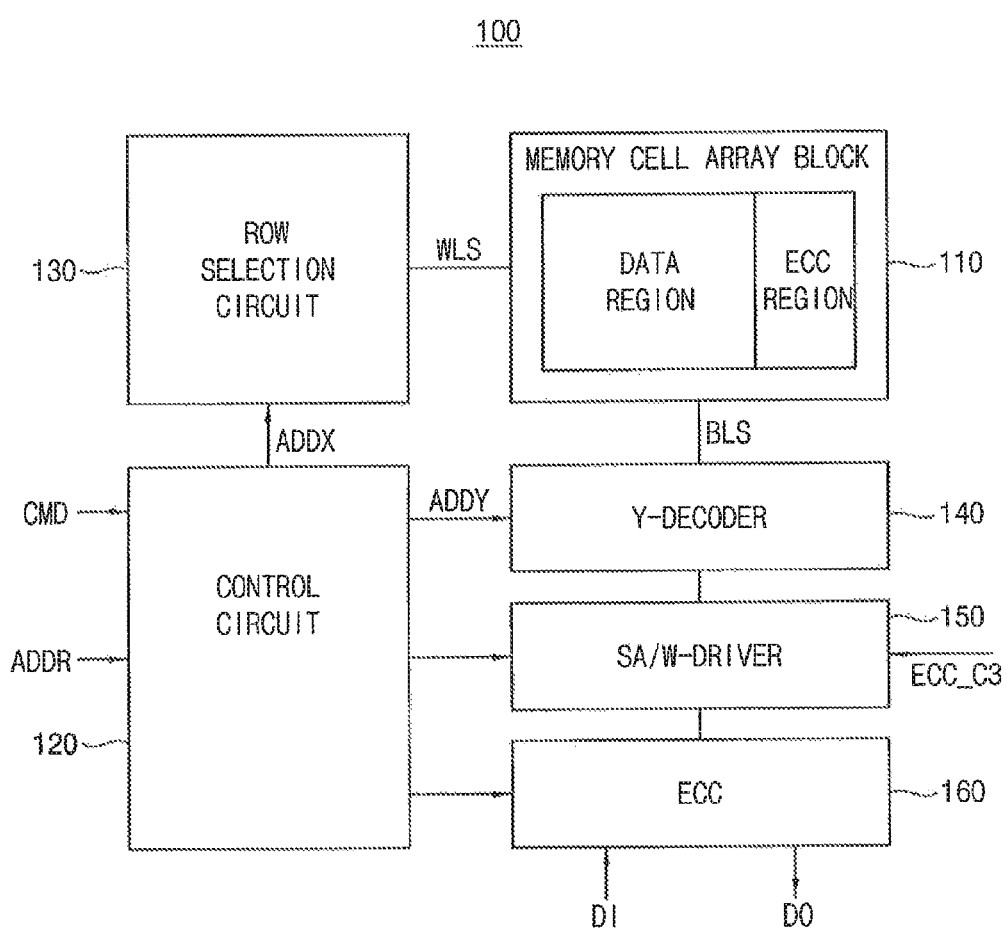
FIG. 4 is a block diagram illustrating an example of a nonvolatile memory chip included in the nonvolatile memory module of FIG. 3 according to an exemplary embodiment of the inventive concept.

FIG. 4 is a block diagram illustrating an example of a nonvolatile memory chip included in the nonvolatile memory module of FIG. 3 according to an exemplary embodiment of the inventive concept.

Each of the plurality of nonvolatile memory chips 100 included in the nonvolatile memory module 10 of FIG. 3 may be implemented with a nonvolatile memory chip 100 of FIG. 4.

Referring to FIG. 4, the nonvolatile memory chip 100 may include a nonvolatile memory cell array block 110, a control circuit 120, a row selection circuit 130, a column decoder (Y-DECODER) 140, an input/output circuit (SA/W-DRIVER) 150, and a second ECC engine 160. The nonvolatile memory chip 100 may further include an address buffer, an input/output buffer, a pre-decoder, and other peripheral circuits The nonvolatile memory cell array block 110 may be coupled to the row selection circuit 130 through a plurality of word lines WLS, and coupled to the column decoder 140 through a plurality of bit lines BLS.

The nonvolatile memory cell array block 110 may include a plurality of resistive memory cells coupled to the plurality of word lines WLS and the plurality of bit lines BLS. Each of the plurality of resistive memory cells may have a resistance that varies based on a logic level of stored data.

According to an exemplary embodiment of the inventive concept, the nonvolatile memory cell array block 110 may be divided into a data region for storing data and an ECC code region for storing an ECC code. In this case, the plurality of resistive memory cells may be divided into data cells in the data region and ECC code cells in the ECC code region.

The plurality of resistive memory cells may be selected by the row selection circuit 130 through the plurality of word lines WLS.

According to an exemplary embodiment of the inventive concept, the nonvolatile memory cell array block 110 may have a three dimensional structure in which the plurality of resistive memory cells thereof are vertically oriented such that at least one resistive memory cell is located over another resistive memory cell.

Figure 5:
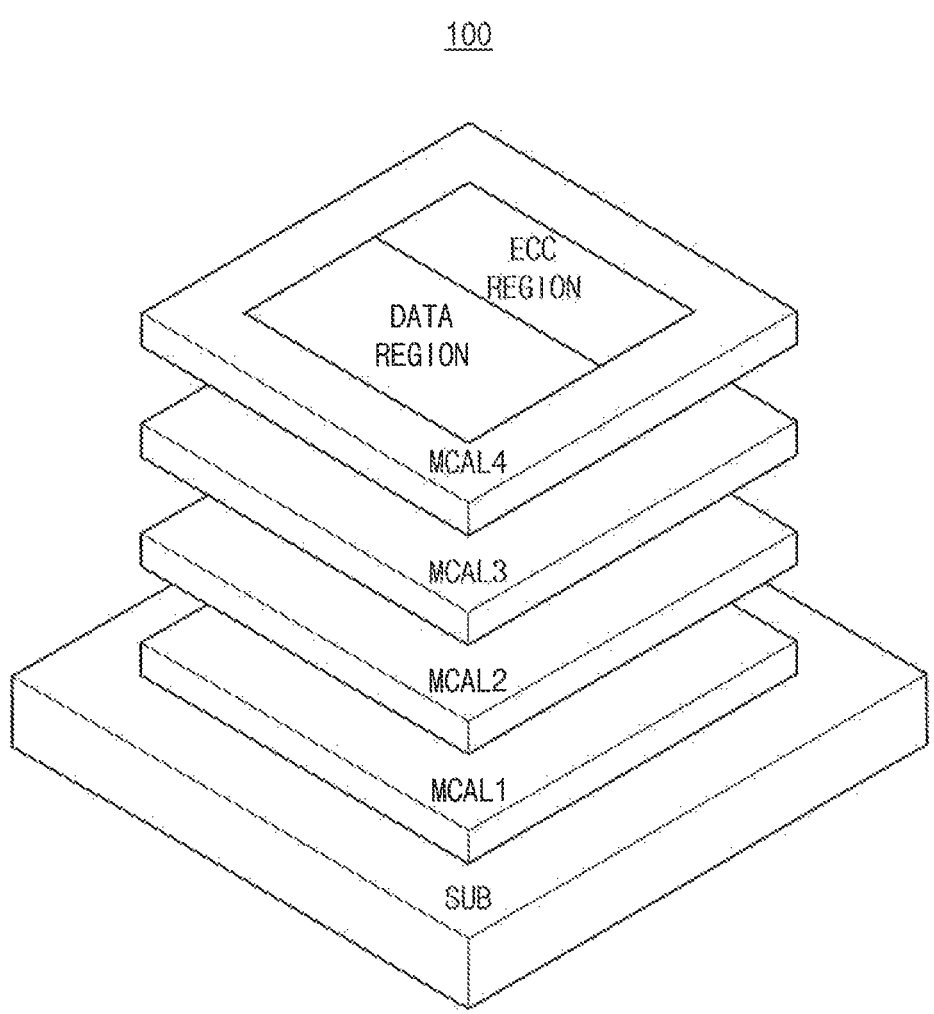
FIG. 5 is a diagram illustrating a three dimensional structure of the nonvolatile memory chip of FIG. 3 according to an exemplary embodiment of the inventive concept.

FIG. 5 is a diagram illustrating a three dimensional structure of the nonvolatile memory chip of FIG. 3 according to an exemplary embodiment of the inventive concept.

As illustrated in FIG. 5, the nonvolatile memory chip 100 may include a plurality of nonvolatile memory cell array layers MCAL1, MCAL2, MCAL3, and MCAL4 disposed on a substrate SUB in a three dimensional structure.

Each of the plurality of nonvolatile memory cell array layers MCAL1, MCAL2, MCAL3, and MCAL4 may include a nonvolatile memory cell array having a plurality of resistive memory cells. In addition, as discussed above, the nonvolatile memory cell array block 110 may be divided into the data region and the ECC code region. The plurality of resistive memory cells included in each of memory cell array layers MCAL1, MCAL2, MCAL3, and MCAL4 may be divided into data cells in the data region and ECC code cells in the ECC code region.

Figure 6:
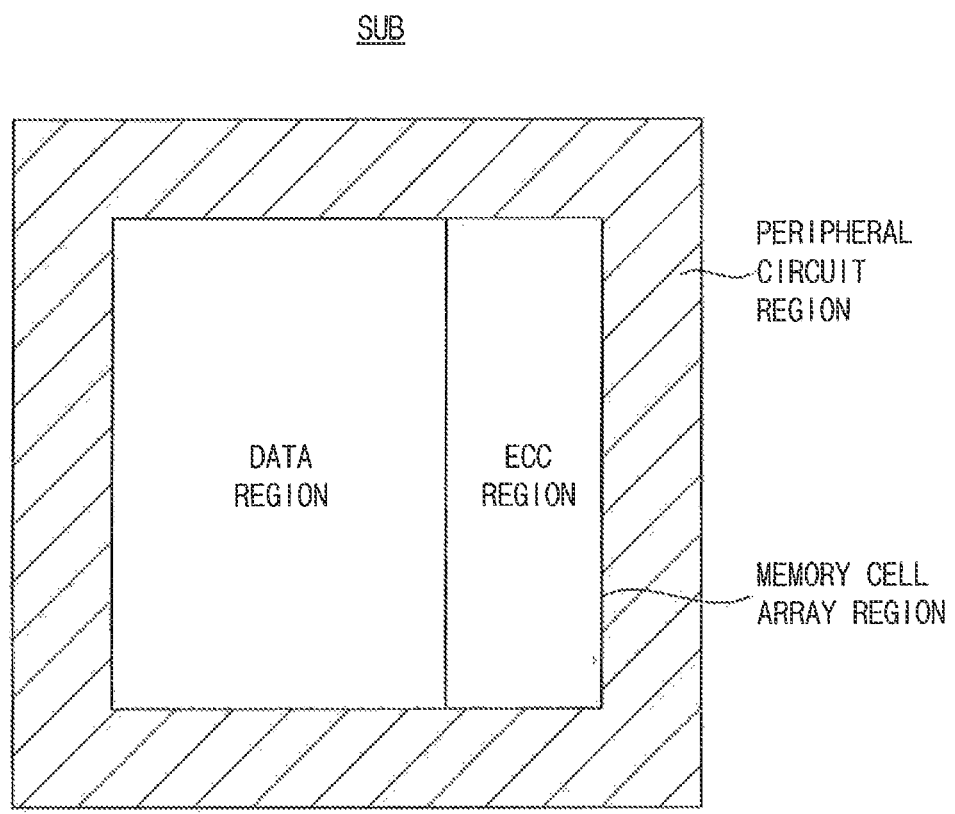
FIG. 6 is a diagram illustrating an example of a substrate included in the nonvolatile memory chip of FIG. 5 according to an exemplary embodiment of the inventive concept.

FIG. 6 is a diagram illustrating an example of a substrate included in the nonvolatile memory chip of FIG. 5 according to an exemplary embodiment of the inventive concept.

As illustrated in FIG. 6, a middle area of the substrate SUB, which faces the plurality of nonvolatile memory cell array layers MCAL1, MCAL2, MCAL3, and MCAL4, may correspond to a memory cell array region in which the nonvolatile memory cell array having the plurality of resistive memory cells is formed. A peripheral area of the substrate SUB, which surrounds the middle area, may correspond to a peripheral circuit region in which peripheral circuits, such as the control circuit 120, the row selection circuit 130, the column decoder 140, the input/output circuit 150, and the second ECC engine 160 (as described with reference to FIG. 4), are formed.

The nonvolatile memory cell array block 110 of FIG. 4 may include the nonvolatile memory cell arrays formed on the plurality of nonvolatile memory cell array layers MCAL1, MCAL2, MCAL3, and MCAL4 and the middle area of the substrate SUB.

Figure 7:
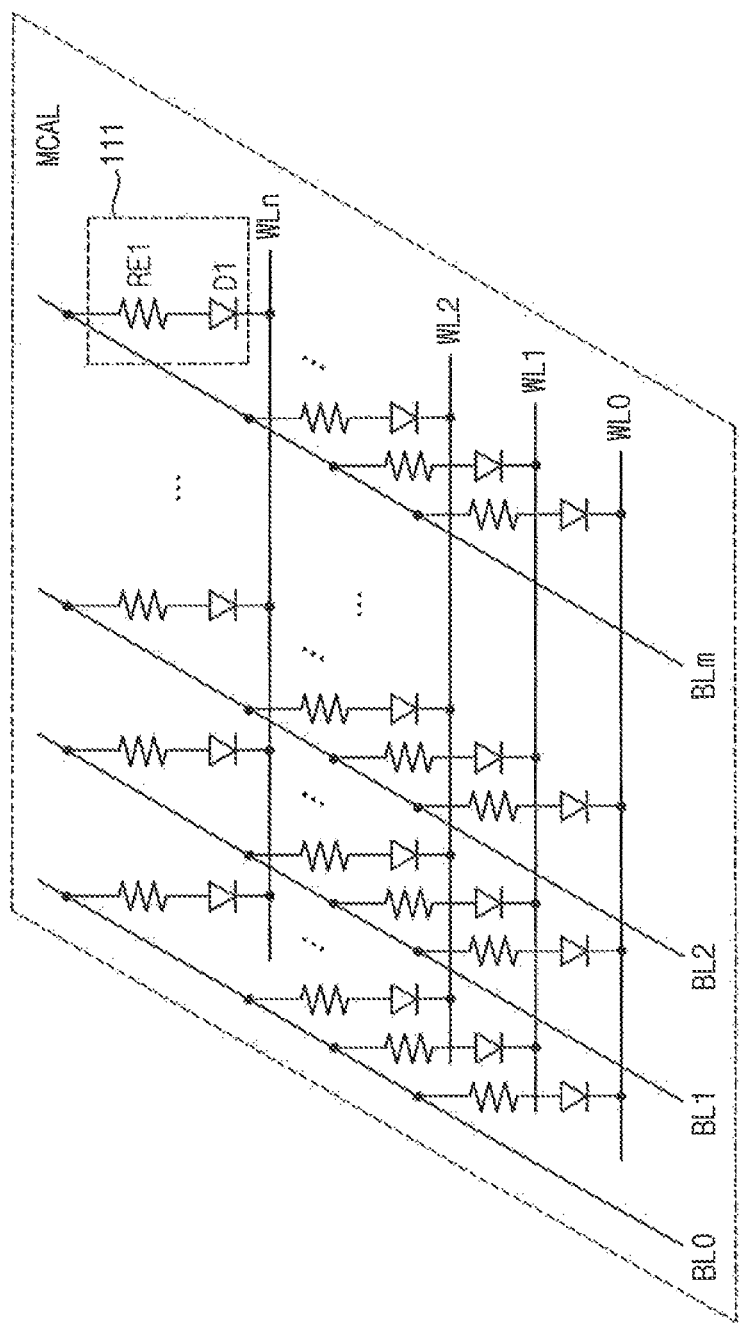
FIG. 7 is a circuit diagram illustrating an example of a nonvolatile memory cell array layer included in the nonvolatile memory chip of FIG. 5 according to an exemplary embodiment of the inventive concept.

FIG. 7 is a circuit diagram illustrating an example of a nonvolatile memory cell array layer included in the nonvolatile memory chip of FIG. 5 according to an exemplary embodiment of the inventive concept.

Each of the plurality of nonvolatile memory cell array layers MCAL1, MCAL2, MCAL3, and MCAL4 included in the nonvolatile memory chip 100 of FIG. 5 may be implemented with a nonvolatile memory cell array layer MCAL of FIG. 7.

Referring to FIG. 7, a plurality of bit lines BL0~BLm and a plurality of word lines WL0~WLn may be formed on the nonvolatile memory cell array layer MCAL.

The nonvolatile memory cell array layer MCAL may have a cross-point structure, and one resistive memory cell may be formed at each intersection of the plurality of bit lines BL0~BLm and the plurality of word lines WL0~WLn.

As illustrated in FIG. 7, the resistive memory cell 111 may include a resistive element RE1 and a diode D1 coupled in series between a corresponding word line WL (e.g., WLn) and a corresponding bit line BL (e.g., BLm).

A resistance distribution of the resistive element RE1 may be controlled by a voltage between the corresponding word line WL and the corresponding bit line BL. According to an exemplary embodiment of the inventive concept, a write operation may be performed on the resistive memory cell 111 by applying voltages between the corresponding word line WL and the corresponding bit line BL, thereby controlling a voltage difference between both ends of the resistive element RE1 or a current flowing through the resistive element RE1.

Figure 8:
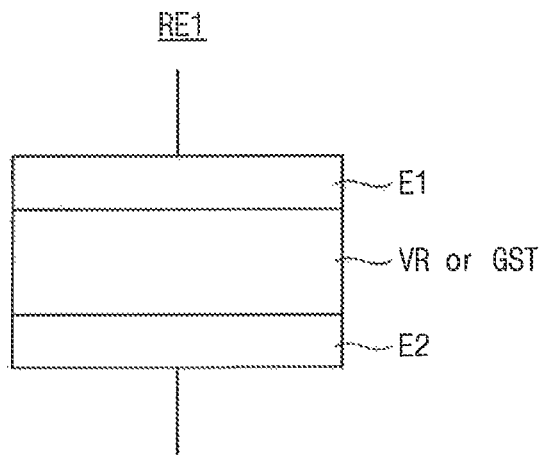
FIG. 8 is a diagram illustrating an example of a resistive element included in a resistive memory cell of FIG. 7 according to an exemplary embodiment of the inventive concept.

FIG. 8 is a diagram illustrating an example of a resistive element included in a resistive memory cell of FIG. 7 according to an exemplary embodiment of the inventive concept.

Referring to FIG. 8, the resistive element RE1 may include a first electrode E1, a second electrode E2, and a resistive material between the first electrode E1 and the second electrode E2. The first electrode E1 and the second electrode E2 may be formed with metal such as tantalum (Ta), platinum (Pt), etc. The resistive material may include a transition-metal oxide (VR) such as cobalt oxide, a phase change material such as GeSbTe (GST), etc. The phase change material may be in an amorphous state or in a crystalline state depending on heating time and/or heating temperature, and thus the phase change material may change its resistance according to the phase change.

Although PRAM using phase change materials, RRAM using materials having variable resistance, and MRAM using ferromagnetism materials may be differentiated from each other, these may be collectively referred to as resistive memories. According to exemplary embodiments of the inventive concept, the nonvolatile memory chip 100 may be implemented with various resistive memories including PRAM, RRAM and MRAM.

Figure 9:
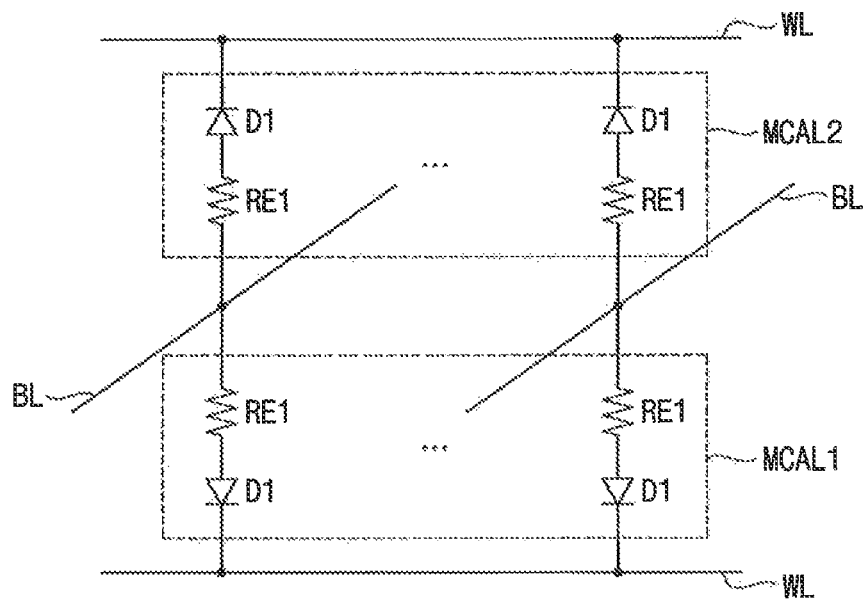
FIG. 9 is a circuit diagram illustrating an example of a nonvolatile memory cell array layer included in the nonvolatile memory chip of FIG. 5 according to an exemplary embodiment of the inventive concept.

FIG. 9 is a circuit diagram illustrating an example of a nonvolatile memory cell array layer included in the nonvolatile memory chip of FIG. 5 according to an exemplary embodiment of the inventive concept.

In FIG. 9, two nonvolatile memory cell array layers MCAL1 and MCAL2 are illustrated. In this example, the nonvolatile memory cell layer MCAL2 is stacked on top of the nonvolatile memory cell layer MCAL1.

As illustrated in FIG. 9, each of the nonvolatile memory cell array layers MCAL1 and MCAL2 may have a cross-point structure, and one resistive memory cell may be formed at an intersection of a bit line BL and a word line WL.

A resistive memory cell formed on each of the nonvolatile memory cell array layers MCAL1 and MCAL2 of FIG. 9 is substantially the same as the resistive memory cell formed on the nonvolatile memory cell array layer MCAL of FIG. 7.

However, as illustrated in FIG. 9, the nonvolatile memory cell array layers MCAL1 and MCAL2, which are stacked, may share the same bit line (e.g., bit line BL).

Therefore, when the nonvolatile memory cell array block 110 is implemented with the nonvolatile memory cell array layers MCAL1 and MCAL2 of FIG. 9, the size of the nonvolatile memory cell array block 110 may be decreased.

Referring back to FIG. 4, the control circuit 120 may receive a command signal CMD and an address signal ADDR from the module controller 200 included in the nonvolatile memory module 10, and control a write operation, a read operation, and an erase operation of the nonvolatile memory chip 100 based on the command signal CMD and the address signal ADDR.

For example, the control circuit 120 may generate timing control signals such as a write enable signal, a read enable signal, a sense enable signal, etc., based on the command signal CMD. In addition, the control circuit 120 may generate a row address ADDX and a column address ADDY based on the address signal ADDR.

The control circuit 120 may provide the timing control signals to the row selection circuit 130, the column decoder 140, and the input/output circuit 150 to control the write operation, the read operation, and the erase operation of the nonvolatile memory chip 100. In addition, the control circuit 120 may provide the row address ADDX to the row selection circuit 130 and the column address ADDY to the column decoder 140.

As described above, the row selection circuit 130 may be coupled to the nonvolatile memory cell array block 110 through the plurality of word lines WLS. The row selection circuit 130 may select one of the plurality of word lines WLS based on the row address ADDX to perform the write operation or the read operation.

As described above, the column decoder 140 may be coupled to the nonvolatile memory cell array block 110 through the plurality of bit lines BLS. The column decoder 140 may select one of the plurality of bit lines BLS based on the column address ADDY and connect the selected bit line to the input/output circuit 150.

The input/output circuit 150 may include a sense amplifier SA and a write driver W-DRIVER.

The second ECC engine 160 may be selectively activated by the module controller 200.

When the second ECC engine 160 is activated, during the write operation, the second ECC engine 160 may receive write data DI from the module controller 200, and generate a second ECC code based on the write data DI.

The write driver W-DRIVER of the input/output circuit 150 may receive the write data DI and the second ECC code corresponding to the write data DI from the second ECC engine 160, and store the write data DI and the second ECC code in the data cells and the ECC code cells, respectively, included in the plurality of nonvolatile memory cell array layers MCAL1, MCAL2, MCAL3, and MCAL4 of the nonvolatile memory cell array block 110.

During the read operation, the sense amplifier SA of the input/output circuit 150 may sense voltage or current of a bit line BL generated by the nonvolatile memory cell array block 110. The sense amplifier SA may use the sensed voltage or current to generate read data DO and the second ECC code, and provide the read data DO and the second ECC code to the second ECC engine 160.

The second ECC engine 160 may detect and correct an error of the read data DO based on the read data DO and the second ECC code received from the sense amplifier SA. The control circuit 120 may control operations of the second ECC engine 160, including code generation, error detection and error correction.

The read data DO output by the second ECC engine 160 may be provided to the module controller 200.

According to an exemplary embodiment of the inventive concept, the second ECC code may be a well-known code such as a parity check code, a Hamming code, etc. For example, the parity check code may be determined such that the ECC calculation results in a constant value. In particular, the ECC calculation may be an exclusive-OR operation on each bit of the read data DO and each bit of the parity check code. The result of the ECC calculation may be "1" in case of an odd parity type, or "0" in case of an even parity type. The second ECC engine 160 may determine that the read data DO includes an error if the result of the ECC calculation is different from a predetermined value, and correct the error in order to output corrected data. As the number of bits in the ECC code increases, the number of error bits that the second ECC engine 160 is able to correct increases along with cell overhead. Therefore, the number of bits to be included in the ECC code may be determined based on the performance requirements for error correction.

When the second ECC engine 160 is deactivated, during the write operation, the write driver W-DRIVER of the input/output circuit 150 may receive the write data DI and a third ECC code ECC_C3, corresponding to the write data DI, from the module controller 200. The write driver W-DRIVER may store the write data DI and the third ECC code ECC_C3 in the data cells and the ECC code cells, respectively, included in the plurality of nonvolatile memory cell array layers MCAL1, MCAL2, MCAL3, and MCAL4 of the nonvolatile memory cell array block 110.

During the read operation, the sense amplifier SA may sense voltage or current of a bit line BL generated by the nonvolatile memory cell array block 110. The sense amplifier SA may use the sensed voltage or current to generate read data DO and the third ECC code ECC_C3, and provide the read data DO and the third ECC code ECC_C3 to the module controller 200.

As described above with reference to FIGS. 1 to 9, since the nonvolatile memory module 10 includes the plurality of nonvolatile memory chips 100 each having the plurality of resistive memory cells, the nonvolatile memory module 10 may be used as both a working memory, which temporarily stores data required for operations of the CPU 20, and a data storage area, which preserves programs and data.

Referring back to FIG. 3, according to an exemplary embodiment of the inventive concept, the ECC code chip 300 may have substantially the same structure as one of the plurality of nonvolatile memory chips 100. For example, the ECC code chip 300 may be implemented with the nonvolatile memory chip 100 of FIG. 4. Therefore, the plurality of nonvolatile memory chips 100 may be used for storing the write data DI provided from the memory controller 30 and the ECC code chip 300 may be used for storing the first ECC code, which corresponds to the write data DI, provided from the memory controller 30.

Figure 10:
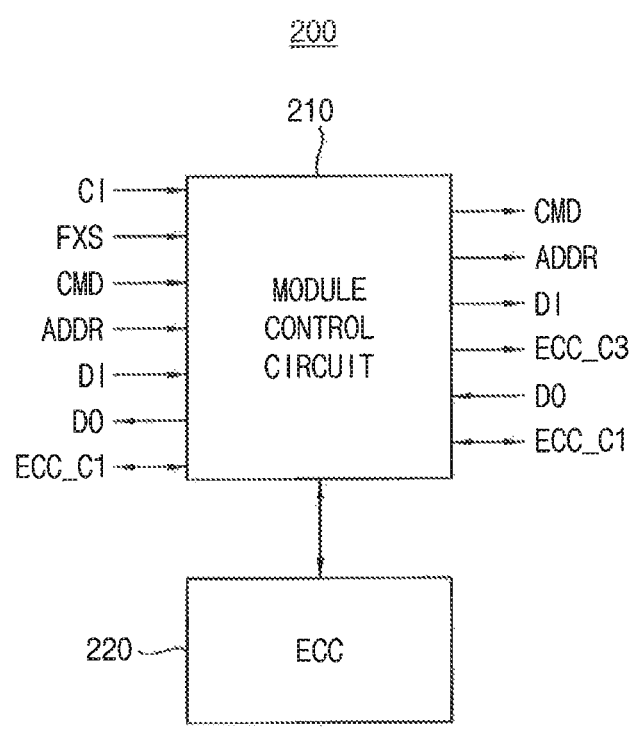
FIG. 10 is a block diagram illustrating an example of a module controller included in the nonvolatile memory module of FIG. 3 according to an exemplary embodiment of the inventive concept.

FIG. 10 is a block diagram illustrating an example of a module controller included in the nonvolatile memory module of FIG. 3 according to an exemplary embodiment of the inventive concept.

Referring to FIG. 10, the module controller 200 may include a module control circuit 210 and a third ECC engine 220.

The third ECC engine 220 may be selectively activated by the module control circuit 210.

According to an exemplary embodiment of the inventive concept, the number of error bits that the third ECC engine 220 is able to correct may be greater than the number of error bits that the second ECC engine 160 included in the nonvolatile memory chip 100 (as described with reference to FIG. 4) is able to correct.

The module control circuit 210 may receive configuration information CI from the memory controller 30 during the initial power-up stage of the electronic device 1000. The configuration information CI may represent the operation mode of the plurality of nonvolatile memory chips 100.

Figure 11:
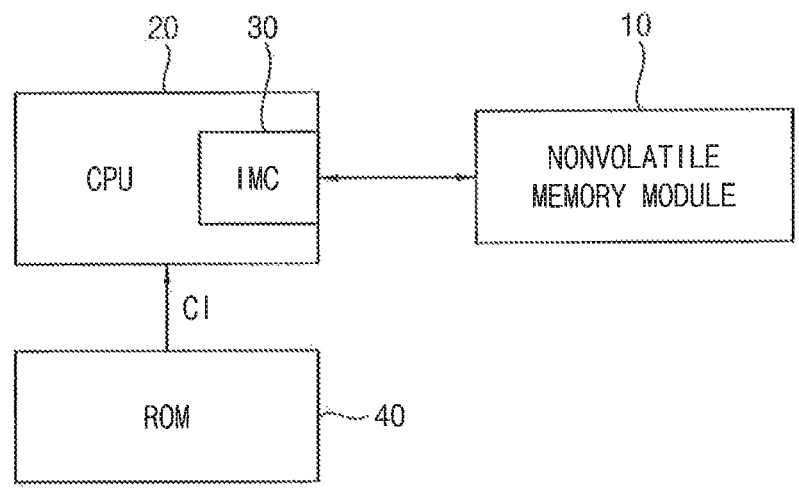
FIG. 11 is a block diagram illustrating an example of the electronic device of FIG. 1 according to an exemplary embodiment of the inventive concept.

FIG. 11 is a block diagram illustrating an example of the electronic device of FIG. 1 according to an exemplary embodiment of the inventive concept.

In contrast with the electronic device 1000 of FIG. 1, an electronic device 1000a of FIG. 11 further includes a read only memory ROM 40.

The ROM 40 may store the configuration information CI, which represents whether the plurality of nonvolatile memory chips 100 operates in the memory mode or in the storage mode at the initial power-up stage of the electronic device 1000.

The CPU 20 may read the configuration information CI from the ROM 40 during the initial power-up stage, and provide the configuration information CI to the module controller 200 included in the nonvolatile memory module 10 through the memory controller 30.

Referring to FIGS. 10 and 11, the module control circuit 210 included in the module controller 200 may determine the operation mode of the plurality of nonvolatile memory chips 100 as either the memory mode and the storage mode, based on the configuration information CI received from the memory controller 30 at the initial power-up stage.

The module control circuit 210 may receive a mode fix signal FXS from the memory controller 30 at the initial power-up stage.

The mode fix signal FXS may represent whether the operation mode of the plurality of nonvolatile memory chips 100 is fixed (e.g., maintained without a change until the electronic device 1000 is turned off), or is variable between the memory mode and the storage mode during the normal operation of the plurality of nonvolatile memory chips 100. For example, when the mode fix signal FXS has a first logic level, the module control circuit 210 may determine that the operation mode of the plurality of nonvolatile memory chips 100 is fixed. On the other hand, when the mode fix signal FXS has a second logic level, the module control circuit 210 may determine that the operation mode of the plurality of nonvolatile memory chips 100 is variable.

Figure 12:
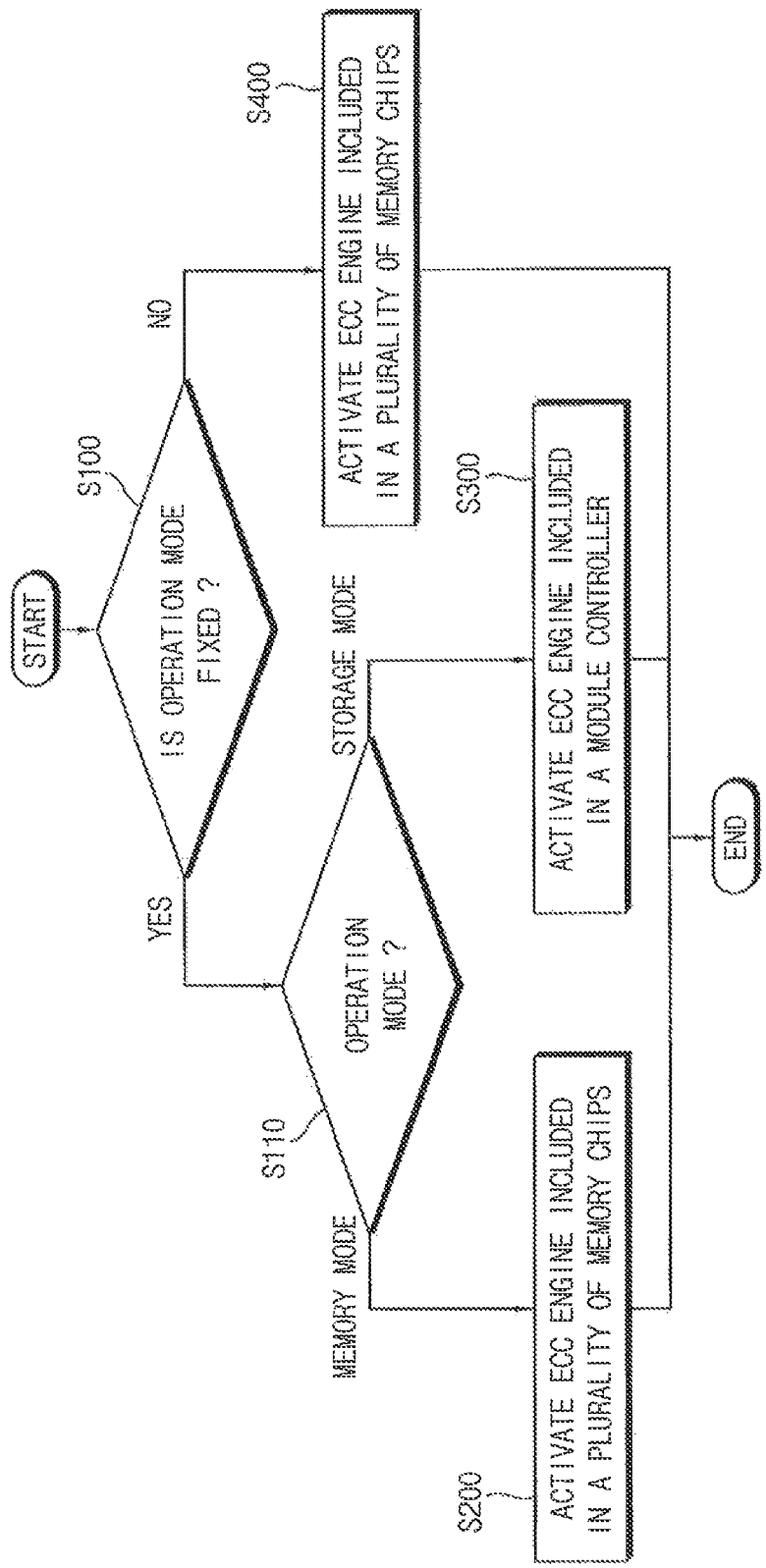
FIG. 12 is a flowchart illustrating an operation of the module controller included in the nonvolatile memory module of FIG. 3 according to an exemplary embodiment of the inventive concept.

FIG. 12 is a flowchart illustrating an operation of the module controller included in the nonvolatile memory module of FIG. 3 according to an exemplary embodiment of the inventive concept.

FIG. 12 represents an operation of the module controller 200 according to whether the operation mode of the plurality of nonvolatile memory chips 100 is fixed or variable and whether the plurality of nonvolatile memory chips 100 operate in the memory mode or the storage mode.

Referring to FIGS. 10 and 12, the module control circuit 210 may determine whether the operation mode of the plurality of nonvolatile memory chips 100 is fixed or variable based on the mode fix signal FXS (step S100).

When the operation mode of the plurality of nonvolatile memory chips 100 is fixed (step S100; yes), the module control circuit 210 may determine whether the plurality of nonvolatile memory chips 100 operate in the memory mode or the storage mode (step S110).

When the operation mode of the plurality of nonvolatile memory chips 100 is fixed as the memory mode, the module control circuit 210 may activate the second ECC engine 160 included in the plurality of nonvolatile memory chips 100 and deactivate the third ECC engine 220 included in the module controller 200 (step S200). Therefore, the plurality of nonvolatile memory chips 100 may perform the second ECC operation on the data stored in the plurality of nonvolatile memory chips 100.

In this case, during the write operation, the module control circuit 210 may receive the command signal CMD, the address signal ADDR, the write data DI, and the first ECC code ECC_C1 (corresponding to the write data DI) from the memory controller 30, provide the command signal CMD, the address signal ADDR, and the write data DI to at least one of the plurality of nonvolatile memory chips 100, and store the first ECC code ECC_C1 in the ECC code chip 300. Based on the command signal CMD and the address signal ADDR, the nonvolatile memory chip 100 may generate the second ECC code corresponding to the write data DI, and store the write data DI and the second ECC code in the data cells and the ECC code cells, respectively, included in the plurality of nonvolatile memory cell array layers MCAL1, MCAL2, MCAL3, and MCAL4.

During the read operation, at least one of the plurality of nonvolatile memory chips 100 may read the read data DO and the second ECC code (corresponding to the read data DO) from the data cells and the ECC code cells, respectively, included in the plurality of nonvolatile memory cell array layers MCAL1, MCAL2, MCAL3, and MCAL4, correct an error of the read data DO based on the second ECC code, and provide the read data DO to the module control circuit 210. The module control circuit 210 may read the first ECC code ECC_C1 corresponding to the read data DO from the ECC code chip 300, and provide the read data DO and the first ECC code ECC_C1 to the memory controller 30.

On the other hand, when the operation mode of the plurality of nonvolatile memory chips 100 is fixed as the storage mode, the module control circuit 210 may deactivate the second ECC engine 160 included in the plurality of nonvolatile memory chips 100 and activate the third ECC engine 220 included in the module controller 200 (step S300). Therefore, the module controller 200 may perform the second ECC operation on the data stored in the plurality of nonvolatile memory chips 100.

In this case, during the write operation, the module control circuit 210 may receive the command signal CMD, the address signal ADDR, the write data DI, and the first ECC code ECC_C1 (corresponding to the write data DI) from the memory controller 30. The module control circuit 210 may provide the write data DI to the third ECC engine 220. The third ECC engine 220 may generate the third ECC code ECC_C3 corresponding to the write data DI and provide the third ECC code ECC_C3 to the module control circuit 210. The module control circuit 210 may provide the command signal CMD, the address signal ADDR, the write data DI, and the third ECC code ECC_C3 to at least one of the plurality of nonvolatile memory chips 100, and store the first ECC code ECC_C1 in the ECC code chip 300. Based on the command signal CMD and the address signal ADDR, the nonvolatile memory chip 100 may store the write data DI and the third ECC code ECC_C3 in the data cells and the ECC code cells, respectively, included in the plurality of nonvolatile memory cell array layers MCAL1, MCAL2, MCAL3, and MCAL4.

During the read operation, at least one of the plurality of nonvolatile memory chips 100 may read the read data DO and the third ECC code ECC_C3 (corresponding to the read data DO) from the data cells and the ECC code cells, respectively, included in the plurality of nonvolatile memory cell array layers MCAL1, MCAL2, MCAL3, and MCAL4, and provide the read data DO and the third ECC code ECC_C3 to the module control circuit 210. The module control circuit 210 may provide the read data DO and the third ECC code ECC_C3 to the third ECC engine 220. The third ECC engine 220 may correct an error of the read data DO based on the third ECC code ECC_C3, and provide the read data DO to the module control circuit 210. The module control circuit 210 may read the first ECC code ECC_C1 (corresponding to the read data DO) from the ECC code chip 300, and provide the read data DO and the first ECC code ECC_C1 to the memory controller 30.

On the other hand, when the operation mode of the plurality of nonvolatile memory chips 100 is variable (step S100; no), the module control circuit 210 may activate the second ECC engine 160 included in the plurality of nonvolatile memory chips 100 and deactivate the third ECC engine 220 included in the module controller 200 regardless of the operation mode of the plurality of nonvolatile memory chips 100 (step S400). Therefore, the plurality of nonvolatile memory chips 100 may perform the second ECC operation on the data stored in the plurality of nonvolatile memory chips 100.

In this case, during the write operation and the read operation, the module controller 200 and the plurality of nonvolatile memory chips 100 may perform substantially the same operations as those described above in relation with step S200.

According to an exemplary embodiment of the inventive concept, the operation mode of the plurality of nonvolatile memory chips 100 included in the nonvolatile memory module 10 may be determined by a command from the CPU 20 during normal operation of the plurality of nonvolatile memory chips 100.

For example, the CPU 20 may generate a mode signal representing whether to operate the plurality of nonvolatile memory chips 100 in the memory mode or in the storage mode during normal operation, and provide the mode signal to the module controller 200 included in the nonvolatile memory module 10 through the memory controller 30.

As such, the module controller 200 may operate the plurality of nonvolatile memory chips 100 in either the memory mode or the storage mode based on the mode signal received from the CPU 20.

According to an exemplary embodiment of the inventive concept, the module controller 200 may determine the operation mode of the plurality of nonvolatile memory chips 100 based on an endurance level of the plurality of nonvolatile memory chips 100 during normal operation of the plurality of nonvolatile memory chips 100.

According to an exemplary embodiment of the inventive concept, the module controller 200 may determine the operation mode of the plurality of nonvolatile memory chips 100 as either the memory mode or the storage mode based on the number of write operations and/or erase operations performed on each of the plurality of nonvolatile memory chips 100.

For example, the module controller 200 may count the number of write operations and/or erase operations performed on each of the plurality of nonvolatile memory chips 100 to generate a use value for each of the plurality of nonvolatile memory chips 100. The number of nonvolatile memory chips 100 having a use value greater than a reference value is counted. When the count is smaller than a threshold value, the module controller 200 may operate the plurality of nonvolatile memory chips 100 in the memory mode. On the other hand, when the count is greater than or equal to the threshold value, the module controller 200 may operate the plurality of nonvolatile memory chips 100 in the storage mode.

As such, the module controller 200 may determine the operation mode of the plurality of nonvolatile memory chips 100 and notify the CPU 20 through the memory controller 30. The CPU 20 may operate the nonvolatile memory module 10 according to the determined operation mode of the plurality of nonvolatile memory chips 100.

As described above with reference to FIGS. 1 to 12, according to an exemplary embodiment of the inventive concept, in the memory system included in the electronic device 1000, the memory controller 30 may perform the first ECC operation on the data communicated with the nonvolatile memory module 10, such that the memory controller 30 may correct a data error that occurs during the process of transmitting data between the memory controller 30 and the nonvolatile memory module 10. The nonvolatile memory module 10 may internally perform the second ECC operation on the data stored in the plurality of nonvolatile memory chips 100, such that the nonvolatile memory module 10 may internally correct a data error that occurs during the process of storing the write data DI, which is received from the memory controller 30, in the plurality of nonvolatile memory chips 100, or during the process of reading the read data DO from the plurality of nonvolatile memory chips 100. As described above, since the memory system hierarchically performs the first ECC operation and the second ECC operation, operation reliability of the memory system may be further increased.

The size of data stored in the plurality of nonvolatile memory chips 100 in the memory mode may be relatively small. Therefore, the operation mode of the plurality of nonvolatile memory chips 100 may be fixed as the memory mode at the initial power-up stage of the electronic device 1000. As such, the second ECC engine 160 included in the plurality of nonvolatile memory chips 100 may be activated and the third ECC engine 220 included in the module controller 200 may be deactivated, such that the plurality of nonvolatile memory chips 100 performs the second ECC operation on the data stored in the plurality of nonvolatile memory chips 100.

On the other hand, the size of data stored in the plurality of nonvolatile memory chips 100 in the storage mode may be relatively large. Therefore, the operation mode of the plurality of nonvolatile memory chips 100 may be fixed as the storage mode at the initial power-up stage of the electronic device 1000. As such, the second ECC engine 160 included in the plurality of nonvolatile memory chips 100 may be deactivated and the third ECC engine 220 included in the module controller 200 may be activated, such that the module controller 200 performs the second ECC operation on the data stored in the plurality of nonvolatile memory chips 100.

In other words, since the number of error bits that the third ECC engine 220 is able to correct is greater than a number of error bits that the second ECC engine 160 is able to correct, the second ECC operation may be performed by the second ECC engine 160 in the memory mode, in which the size of data stored in the plurality of nonvolatile memory chips 100 is relatively small. On the other hand, the second ECC operation may be performed by the third ECC engine 220 in the storage mode, in which the size of data stored in the plurality of nonvolatile memory chips 100 in the storage mode is relatively large. Therefore, overall ECC operation of the memory system may be optimized according to the operation mode of the plurality of nonvolatile memory chips 100.

When the operation mode of the plurality of nonvolatile memory chips 100 is variable between the memory mode and the storage mode during normal operation of the plurality of nonvolatile memory chips 100, only one of the second ECC engine 160 and the third ECC engine 220 may be required to perform the second ECC operation regardless of the operation mode of the plurality of nonvolatile memory chips 100. If the second ECC operation is performed by the third ECC engine 220, which is able to correct a relatively large number of error bits, in the memory mode, speed of ECC decoding of the memory system may be decreased. Therefore, when the operation mode of the plurality of nonvolatile memory chips 100 is variable, the memory system may perform the second ECC operation using the second ECC engine 160 regardless of the operation mode of the plurality of nonvolatile memory chips 100. As such, speed of ECC decoding of the memory system may be increased.

While the inventive concept has been shown and described with reference to exemplary embodiments thereof, it will be apparent to those of ordinary skill in the art that various modifications in form and detail may be made thereto without materially departing from the spirit and scope of the present inventive concept as defined by the following claims.

What is claimed is:

1. A memory system, comprising:
a nonvolatile memory module including a plurality of memory chips and a module controller disposed on a printed circuit board (PCB), the module controller controlling operations of the plurality of memory chips, each of the plurality of memory chips including a plurality of nonvolatile memory cells and configured to operate in an operation mode; and
a memory controller configured to perform a write operation and a read operation on the nonvolatile memory module, and to perform a first error check and correction (ECC) operation on data communicated with the nonvolatile memory module,
wherein the operation mode is either a memory mode or a storage mode,
the mean data storage time of the memory mode is less than the mean data storage time of the storage mode, and
one of the module controller or the plurality of memory chips performs a second ECC operation on data stored in the plurality of memory chips based on the operation mode of the plurality of memory chips.

2. The memory system of claim 1, wherein
during a write operation, the memory controller generates an ECC code for a write data, and provides the write data and the ECC code to the module controller, and
during a read operation, the memory controller receives a read data and the ECC code from the module controller, and corrects an error of the read data based on the ECC code.

3. The memory system of claim 2, wherein
the nonvolatile memory module further includes an ECC code chip that is disposed on the PCB and includes a plurality of nonvolatile memory cells,
during the write operation, the module controller stores the write data in at least one of the plurality of memory chips, and stores the ECC code in the ECC code chip, and
during the read operation, the module controller reads the read data from the plurality of memory chips, reads the ECC code corresponding to the read data from the ECC code chip, and provides the read data and the ECC code to the memory controller.

4. The memory system of claim 1, wherein the operation mode of the plurality of memory chips is fixed as either the memory mode or the storage mode at an initial power-up stage.

5. The memory system of claim 4, wherein when the plurality of memory chips operates in the memory mode, the plurality of memory chips performs the second ECC operation on the data stored in the plurality of memory chips.

6. The memory system of claim 5, wherein during the write operation, the module controller receives a write data from the memory controller, and provides the write data to at least one of the plurality of memory chips, and when receiving the write data from the module controller, the at least one of the plurality of memory chips generates an ECC code for the write data, and stores the write data and the ECC code in the plurality of nonvolatile memory cells included in the at least one of the plurality of memory chips.

7. The memory system of claim 5, wherein during the read operation, at least one of the plurality of memory chips reads a read data and an ECC code corresponding to the read data from the plurality of nonvolatile memory cells included in the at least one of the plurality of memory chips, corrects an error of the read data based on the ECC code, and provides the read data to the module controller, and the module controller provides the read data received from the at least one of the plurality of memory chips to the memory controller.

8. The memory system of claim 4, wherein when the plurality of memory chips operates in the storage mode, the module controller performs the second ECC operation on the data stored in the plurality of memory chips.

9. The memory system of claim 8, wherein during the write operation, the module controller receives a write data from the memory controller, generates an ECC code for the write data, and provides the write data and the ECC code to at least one of the plurality of memory chips, and when receiving the write data and the ECC code from the module controller, the at least one of the plurality of memory chips stores the write data and the ECC code in the plurality of nonvolatile memory cells included in the at least one of the plurality of memory chips.

10. The memory system of claim 8, wherein during the read operation, at least one of the plurality of memory chips provides a read data and an ECC code corresponding to the read data, which are stored in the plurality of nonvolatile memory cells included in the at least one of the plurality of memory chips, to the module controller, and the module controller corrects an error of the read data based on the ECC code received from the at least one of the plurality of memory chips, and provides the read data to the memory controller.

11. The memory system of claim 1, wherein the operation mode of the plurality of memory chips is variable during a normal operation of the plurality of memory chips.

12. The memory system of claim 11, wherein the module controller determines the operation mode of the plurality of memory chips as either the memory mode or the storage mode based on an endurance level of the plurality of memory chips during the normal operation of the plurality of memory chips.

13. The memory system of claim 11, wherein regardless of the operation mode of the plurality of memory chips, the plurality of memory chips performs the second ECC operation on the data stored in the plurality of memory chips.

14. The memory system of claim 1, wherein the plurality of memory chips include a plurality of resistive memory cells, and each of the plurality of resistive memory cells has a resistance that varies based on a logic level of a stored data.

15. The memory system of claim 1, wherein the plurality of memory chips and the module controller are disposed on the PCB according to a nonvolatile dual in-line memory module (NVDIMM) standard.

16. A memory system, comprising:
a nonvolatile memory module including a plurality of memory chips and a module controller disposed on a printed circuit board (PCB), the module controller controlling operations of the plurality of memory chips, each of the plurality of memory chips including a plurality of nonvolatile memory cells and configured to operate in an operation mode; and
a memory controller configured to perform a write operation and a read operation on the nonvolatile memory module, and to perform a first error check and correction (ECC) operation on data communicated with the nonvolatile memory module,
wherein the operation mode is either a memory mode or a storage mode,
the mean data storage time of the memory mode is less than the mean data storage time of the storage mode, and
one of the module controller or the plurality of memory chips performs a second ECC operation on data stored in the plurality of memory chips based on whether the operation mode of the plurality of memory chips is variable during a normal operation of the plurality of memory chips.

17. The memory system of claim 16, wherein when the operation mode of the plurality of memory chips is fixed as the memory mode at an initial power-up stage, the plurality of memory chips performs the second ECC operation on the data stored in the plurality of memory chips.

18. The memory system of claim 16, wherein when the operation mode of the plurality of memory chips is fixed as the storage mode at an initial power-up stage, the module controller performs the second ECC operation on the data stored in the plurality of memory chips.

19. The memory system of claim 16, wherein when the operation mode of the plurality of memory chips is variable during the normal operation of the plurality of memory chips, the plurality of memory chips performs the second ECC operation on the data stored in the plurality of memory chips regardless of the operation mode of the plurality of memory chips.

20. An electronic device, comprising:
a nonvolatile memory module including a plurality of memory chips and a module controller disposed on a printed circuit board (PCB), the module controller controlling operations of the plurality of memory chips, each of the plurality of memory chips including a plurality of nonvolatile memory cells and configured to operate in an operation mode;
a read only memory (ROM) storing configuration information representing the operation mode of the plurality of memory chips;
a central processing unit (CPU); and
a memory controller configured, under a control of the CPU, to perform a write operation and a read operation on the nonvolatile memory module, and to perform a first error check and correction (ECC) operation on data communicated with the nonvolatile memory module,
wherein the operation mode is either a memory mode or a storage mode,
the mean data storage time of the memory mode is less than the mean data storage time of the storage mode, and
one of the module controller or the plurality of memory chips performs a second ECC operation on data stored in the plurality of memory chips, based on whether the operation mode of the plurality of memory chips is variable during a normal operation of the plurality of memory chips and whether the plurality of memory chips operates in the memory mode or the storage mode.

\* \* \* \* \*